(12) United States Patent
Doris et al.

(10) Patent No.: US 10,395,922 B2
(45) Date of Patent: *Aug. 27, 2019

(54) ATOMIC LAYER DEPOSITION SEALING INTEGRATION FOR NANOSHEET COMPLEMENTARY METAL OXIDE SEMICONDUCTOR WITH REPLACEMENT SPACER

(71) Applicant: INTERNATIONAL BUSINESS MACHINES CORPORATION, Armonk, NY (US)

(72) Inventors: Bruce B. Doris, Slingerlands, NY (US); Michael A. Guillorn, Cold Springs, NY (US); Isaac Lauer, Yorktown Heights, NY (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 53 days.

This patent is subject to a terminal disclaimer.

(21) Appl. No.: 15/832,119

(22) Filed: Dec. 5, 2017

(65) Prior Publication Data

US 2018/0096835 A1 Apr. 5, 2018

Related U.S. Application Data

(60) Continuation of application No. 15/254,394, filed on Sep. 1, 2016, now Pat. No. 9,911,592, which is a
(Continued)

(51) Int. Cl.
*H01L 21/02* (2006.01)
*H01L 29/66* (2006.01)
(Continued)

(52) U.S. Cl.
CPC .... *H01L 21/0228* (2013.01); *H01L 21/02603* (2013.01); *H01L 21/30604* (2013.01);
(Continued)

(58) Field of Classification Search
CPC ........... H01L 21/0228; H01L 29/78696; H01L 29/0673; H01L 29/775; H01L 29/66349;
(Continued)

(56) References Cited

U.S. PATENT DOCUMENTS 7,456,476 B2 11/2008 Hareland et al.
7,892,945 B2 2/2011 Bedell et al.
(Continued)

OTHER PUBLICATIONS

List of IBM Patents or Patent Applications Treated as Related dated Dec. 5, 2017, 2 pages.
(Continued)

*Primary Examiner* — Thomas L Dickey
(74) *Attorney, Agent, or Firm* — Tutunjian & Bitetto, P.C.; Vazken Alexanian

(57) ABSTRACT

A semiconductor device including a gate structure present on at least two suspended channel structures, and a composite spacer present on sidewalls of the gate structure. The composite spacer may include a cladding spacer present along a cap portion of the gate structure, and an inner spacer along the channel portion of the gate structure between adjacent channel semiconductor layers of the suspended channel structures. The inner spacer may include a crescent shape with a substantially central seam.

18 Claims, 10 Drawing Sheets

Related U.S. Application Data division of application No. 14/846,428, filed on Sep. 4, 2015, now Pat. No. 9,647,139.

(51) Int. Cl.
    *H01L 21/306*     (2006.01)
    *H01L 29/06*     (2006.01)
    *H01L 29/423*     (2006.01)
    *H01L 29/775*     (2006.01)
    *H01L 29/786*     (2006.01)

(52) U.S. Cl.
    CPC .... H01L 29/0673 (2013.01); H01L 29/42392 (2013.01); H01L 29/66439 (2013.01); H01L 29/66545 (2013.01); H01L 29/66742 (2013.01); H01L 29/66795 (2013.01); H01L 29/775 (2013.01); H01L 29/78684 (2013.01); H01L 29/78696 (2013.01)

(58) Field of Classification Search
    CPC ........... H01L 29/42392; H01L 21/0263; H01L 21/30604
    See application file for complete search history.

(56) References Cited

U.S. PATENT DOCUMENTS

| | | | |
|---|---|---|---|
| 8,084,308 B2 | 12/2011 | Chang et al. | |
| 8,395,220 B2 | 3/2013 | Chang et al. | |
| 8,753,942 B2 | 6/2014 | Kuhn et al. | |
| 8,802,512 B2 | 8/2014 | Leobandung | |
| 8,809,131 B2 | 8/2014 | Bangsaruntip et al. | |
| 8,969,149 B2 | 3/2015 | Leobandung | |
| 9,647,139 B2 * | 5/2017 | Doris | H01L 21/0228 |
| 9,812,321 B2 * | 11/2017 | Doris | H01L 21/0228 |
| 9,911,592 B2 * | 3/2018 | Doris | H01L 21/0228 |
| 2008/0020537 A1 * | 1/2008 | Kim | H01L 29/42392 438/308 |
| 2010/0200897 A1 | 8/2010 | Heringa et al. | |
| 2010/0297816 A1 | 11/2010 | Bedell et al. | |
| 2011/0057163 A1 * | 3/2011 | Liu | B82Y 10/00 257/9 |
| 2011/0059598 A1 * | 3/2011 | Saracco | B82Y 10/00 438/479 |
| 2011/0272873 A1 | 11/2011 | Bangsaruntip et al. | |
| 2012/0168872 A1 | 7/2012 | Chang et al. | |
| 2013/0069041 A1 | 3/2013 | Zhu et al. | |
| 2013/0135949 A1 * | 5/2013 | An | G11C 13/0069 365/191 |
| 2014/0001441 A1 * | 1/2014 | Kim | H01L 29/0673 257/29 |
| 2014/0001520 A1 * | 1/2014 | Glass | H01L 29/66439 257/288 |
| 2014/0151639 A1 | 4/2014 | Chang et al. | |
| 2014/0191335 A1 | 7/2014 | Yin et al. | |
| 2014/0197370 A1 | 7/2014 | Leobandung | |
| 2014/0209864 A1 * | 7/2014 | Bangsaruntip | H01L 21/77 257/29 |
| 2014/0326952 A1 | 11/2014 | Kuhn et al. | |
| 2015/0047853 A1 * | 2/2015 | Hurtado | E21B 7/061 166/377 |
| 2015/0069328 A1 | 3/2015 | Leobandung | |
| 2015/0102287 A1 | 4/2015 | Wang et al. | |
| 2016/0027870 A1 | 1/2016 | Cheng et al. | |
| 2016/0027929 A1 * | 1/2016 | Cheng | H01L 29/78696 257/9 |
| 2016/0181352 A1 | 6/2016 | Cheng et al. | |
| 2017/0194510 A1 * | 7/2017 | Doris | H01L 21/0228 |

OTHER PUBLICATIONS

U.S. Office Action issued in U.S. Appl. No. 15/254,442, dated Apr. 20, 2017, pp. 1-24.

U.S. Office Action issued in related U.S. Appl. No. 15/467,555, dated Sep. 22, 2017, pp. 1-25.

* cited by examiner

ATOMIC LAYER DEPOSITION SEALING INTEGRATION FOR NANOSHEET COMPLEMENTARY METAL OXIDE SEMICONDUCTOR WITH REPLACEMENT SPACER

BACKGROUND

Technical Field

The present disclosure relates to semiconductor devices, and more particularly to semiconductor devices including channel regions integrated within nanowires and nano-sheets.

Description of the Related Art

With the continuing trend towards miniaturization of integrated circuits (ICs), there is a need for transistors to have higher drive currents with increasingly smaller dimensions. The use of non-planar semiconductor devices such as, for example, nanowire and nano-sheet transistors may be the next step in the evolution of complementary metal oxide semiconductor (CMOS) devices.

SUMMARY

In one embodiment, a method of forming a suspended channel field effect transistor (FET) is provided in which a composite spacer is employed to avoid shorting of the gate structure. In some embodiments, the method may include forming a gate structure on a stack of two semiconductor materials that can be etched selectively to one another. A spacer is formed on sidewalls of the gate structure. The exposed portions of the stack of two semiconductor materials is etched by a first etch process, wherein the first etch process includes at least one step that removes one of the at least two semiconductor materials than a remainder of the materials in the stack at a faster rate to provide a divot region undercutting the spacer. An atomic layer deposited (ALD) conformal dielectric layer is formed over the gate structure, and etched sidewalls of the stack of two semiconductor materials, wherein the ALD conformal dielectric layer fills the divot. A second etch process exposes sidewalls of the stack of the two semiconductor materials. Epitaxial semiconductor material is formed on exposed sidewalls of the stack of the two semiconductor materials.

In another embodiment, the present disclosure provides a method of forming a semiconductor device that includes forming a gate structure on a stack of two semiconductor materials that can be etched selectively to one another. A spacer is present on sidewalls of the gate structure. The exposed portions of the stack of two semiconductor materials are treated with a first etch process, wherein the first etch process removes one of the at least two semiconductor materials selectively to a second of the at least two semiconductor materials to provide suspended source and drain semiconductor layers. The first etch process also produces a divot region undercutting the spacer between the suspended source and drain semiconductor layers. In some embodiments, an atomic layer deposited (ALD) conformal dielectric layer is deposited that fills the divot. Epitaxial semiconductor material may be formed on the suspended source and drain semiconductor layers.

In yet another embodiment, a method of forming a semiconductor device is provided that includes forming a replacement gate structure on a stack of two semiconductor materials that can be etched selectively to one another. A spacer is present on sidewalls of the gate structure. The replacement gate structure is removed to provide a gate opening that exposes a channel portion of the stack of the two semiconductor materials. A first etch process removes one of the at least two semiconductor materials in the channel opening to provide suspended channel semiconductor layers, and a divot region undercutting the spacer between the suspended channel semiconductor layers. An atomic layer deposited (ALD) conformal dielectric layer is formed on sidewalls of the channel opening, wherein the ALD conformal dielectric layer fills the divot. A second etch process exposes sidewalls of the channel opening, wherein the divot remains filled with a remaining portion of the ALD conformal dielectric layer. A functional gate structure is formed in the channel opening.

In another aspect of the present disclosure, a semiconductor device is provided. The semiconductor device may include a gate structure present on at least two suspended channel structures. A composite spacer may be formed on sidewalls of the first gate structure. The composite spacer may include a cladding spacer present along a cap portion of the gate structure, and an inner spacer along the channel portion of the gate structure between adjacent channel semiconductor layers of said at least two suspended channel structures. The inner spacer may comprise a crescent shape with a substantially central seam.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
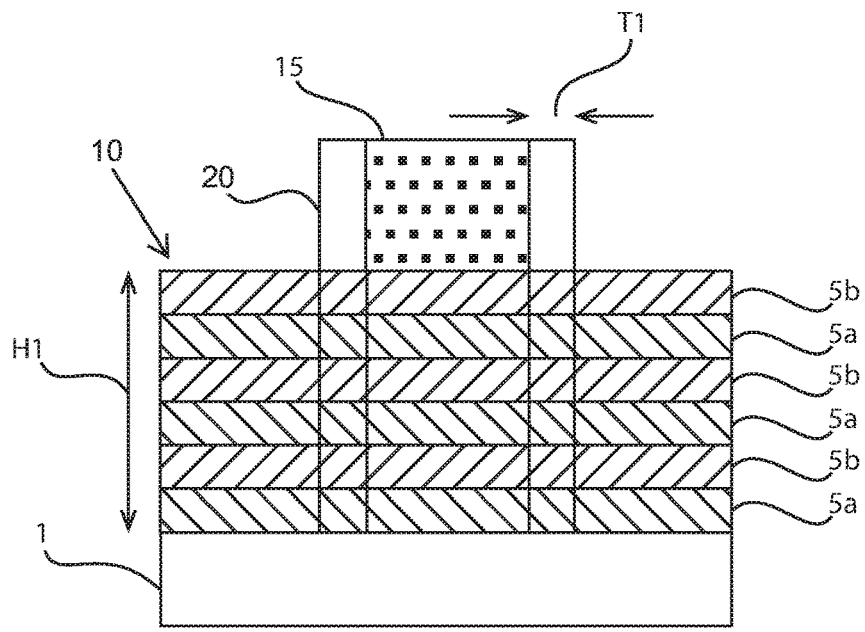
FIG. 1 is a side cross-sectional view of a forming a gate structure on a stack of at least two semiconductor materials that can be etched selectively to one another, wherein a spacer present on sidewalls of the gate structure, in accordance with one embodiment of the present disclosure.

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe a nanowire and nano-sheet transistors having cladding (also referred to as external spacers) and inner spacers formed at the portions of the interface of the source/drain region and the channel region that are internal to the nanowire/nano-sheet stack. The nanowire/nano-sheet device has a wrap-around gate, which defines a channel region of the device. Source/drain regions are disposed on opposite sides of the channel region. A pair of external gate sidewall spacers (also referred to as cladding spacers) is formed on the portion of the gate sidewalls that are external to the nanowire stack. The internal spacers are formed by atomic layer deposition within the source/drain region of the transistor, between adjacent nanowires/nano-sheets and adjacent to the channel region/gate structure. The internal spacers provide additional insulation between the gate structure and source/drain contacts, which reduces overlap capacitance, risk of shorting, and current leakage. The internal sidewall spacers may be formed of the same or different material as the external sidewall spacers (cladding spacer). Additionally, the internal sidewall spacers may be of the same or different thickness as the external sidewall spacers (cladding spacers).

In one aspect, embodiments of the present disclosure describe a method for forming internal spacers by depositing spacer material such as oxide and nitride containing dielectrics by atomic layer deposition in divots formed adjacent to the channel region, where the divots are formed by etching from the source/drain side of the source/drain-channel interface. For example, a preliminary structure having a nanowire/nanosheet stack disposed on a substrate and a gate structure defining a channel region within the nanowire/nanosheet stack is provided. Source and drain regions of the device are disposed on opposite sides of the channel region.

The gate structure has a pair of gate sidewalls, and may be functional or sacrificial. In one embodiment, external gate sidewall spacers (cladding spacers) are formed on the portion of the gate structure sidewalls that are external to the nanowire/nanosheet stack. Within the source/drain regions, the nanowire/nanosheet stack consists of alternating layers of nanowire/nano-sheet material and sacrificial material. The sacrificial material between the nanowires/nanosheets is removed from the source/drain region to expose the edge the channel region. A divot (also referred to as undercut region) can be formed adjacent to the channel region, defined by the two sidewalls of the adjacent nanowires, the two adjacent exposed surfaces of the external sidewall spacers, and the edge of the channel region. The divot is open to the source/drain region. Atomic layer deposited spacer material, i.e., inner spacer material, such as an oxide or nitride dielectric, may be conformally deposited over the exposed surfaces within the source/drain region, such that it fills the divot volumes. The inner spacer material may also fill the spaces between adjacent nanowires/nano-sheets. Additional processing steps may then be performed to form a functioning device, such as forming source/drain contacts or forming a functional gate structure. In a completed device, the internal spacers isolate the gate structure from the source/drain region, together with the external sidewall spacers, to reduce overlap capacitance. The atomic layer deposited inner spacers provided by methods and structures of the present disclosure may employ conventional dielectric materials, such as silicon dioxide and silicon nitride. There is no requirement for specially formatting under fill compositions for use with the methods disclosed herein. The methods and structure of the present disclosure control channel undercut in process flows for forming nanowire/nano-sheet transistors. Additionally, the methods and structures disclosure herein do not require the use of sacrificial spacers as used in prior process flows for forming nano-sheet and nanowire type devices. Further details regarding the method and structures of the present disclosure are now described with reference to FIGS. 1-18.

FIG. 1 depicts one embodiment of forming a gate structure 15 on a stack 10 of at least two semiconductor materials 5a, 5b that can be etched selectively to one another, wherein a spacer 20 present on sidewalls of the gate structure 15. The gate stack 10 of the at least two semiconductor materials 5a, 5b may be present on a substrate 1. The substrate 1 may be composed of a supporting material, such as a semiconductor material, e.g., silicon, or dielectric material, such as silicon oxide or silicon nitride.

The stack 10 of the at least two semiconductor materials 5a, 5b is typically composed of two alternating materials. For example, the first semiconductor material 5a that is present on the substrate 1 may be composed of a silicon and germanium containing semiconductor material, such as silicon germanium (SiGe), whereas the second semiconductor material 5b that is present on the first semiconductor material 5b may be composed of a germanium free silicon containing semiconductor material, such as silicon (Si). It is noted that this is only one example of semiconductor materials that may be used for the at least two semiconductor materials 5a, 5b. Any semiconductor material composition may be used for each of the at least two semiconductor materials 5a, 5b so long as at least one of the compositions selected allow for selective etching between at least two of them. Any type IV semiconductor composition combination and/or III-V semiconductor composition combination is suitable for use with the present disclosure. For example, the compositions selected for the at least two semiconductor materials include Si, SiGe, SiGeC, SiC, single crystal Si, polysilicon, i.e., polySi, epitaxial silicon, i.e., epi-Si, amorphous Si, i.e., α:Si, germanium, gallium arsenide, gallium nitride, cadmium telluride and zinc sellenide.

Although FIG. 1 only depicts two semiconductor material layers in the stack 10 of the at least two semiconductor materials 5a, 5b, it is noted that the present disclosure is not limited to only this example. Any number of semiconductor material layers 5a, 5b may be present in the stack 10. For example, the number of semiconductor material layers 5a, 5b in the stack may also be equal to 3, 4, 5, 10, 15 and 20, as well as any value between the aforementioned examples.

The stack 10 of the at least two semiconductor materials 5a, 5b may be formed using a deposition process, such as chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes suitable for use the present disclosure include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

The thickness of each of the at least two semiconductor material layers 5a, 5b, may range from 1 nm to 30 nm. In another embodiment, the thickness of each of the at least two semiconductor material layers 5a, 5b, may range from 5 nm to 20 nm.

Following deposition, the semiconductor material layers 5a, 5b may be patterned to provide the geometry of the stack. In some embodiments, the semiconductor material layers 5a, 5b may be patterned using deposition, photolithography and subtractive etch processing. In one example, the stack 10 may have a height $H_1$ ranging from 5 nm to 200 nm, and a width ranging from 5 nm to 60 nm.

Still referring to FIG. 1, the process flow may continue with forming a replacement gate structure 15 on a channel portion of the stack 10 of the at least two semiconductor materials 5a, 5b. By "replacement" it is meant that the structure is present during processing of the semiconductor device, but is removed from the semiconductor device prior to the device being completed. In the present process flow, a replacement gate structure 15 is employed as part of a replacement gate process. As used herein, the term "replacement gate structure" denotes a sacrificial structure that dictates the geometry and location of the later formed functioning gate structure. The "functional gate structure" operates to switch the semiconductor device from an "on" to "off" state, and vice versa.

In one embodiment, the sacrificial material that provides the replacement gate structure 15 may be composed of any material that can be etched selectively to the at least one of the material layers of the stack 10 of the at least two semiconductor materials 5a, 5b. In one embodiment, the replacement gate structure 15 may be composed of a silicon-including material, such as polysilicon. In another embodiment, the replacement gate structure 15 may be composed of a dielectric material, such as an oxide, nitride or oxynitride material, or amorphous carbon. The replacement gate structure 15 may be formed using deposition (e.g., chemical vapor deposition) photolithography and etch processes (e.g., reactive ion etching).

Still referring to FIG. 1, a spacer 20 is formed on the sidewall of the replacement gate structure 15. The spacer 20 is typically composed of a dielectric material, such as an oxide, nitride, or oxynitride material. In one example, when the spacer 20 is composed of a nitride, the spacer 20 may be composed of silicon nitride, and when the spacer 20 is composed of oxide, the spacer 20 may be composed of silicon oxide. In another example, the spacer 20 may be composed of a low-k dielectric. In some examples, the low-k dielectric of the spacer 20 may have a dielectric constant of 4.0 or less (measured at room temperature, e.g., 25° C., and 1 atm). For example, a low-k dielectric material suitable for the spacer 20 may have a dielectric constant ranging from about 1.0 to about 3.0. Examples of low-k materials suitable for the spacer 20 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The spacer 20 may be formed using a deposition process, such as chemical vapor deposition (CVD), and an anisotropic etchback method. The spacer 20 may be present on the sidewalls of the replacement gate structure 15, and may have a thickness T1 ranging from 1 nm to 15 nm.

Figure 2:
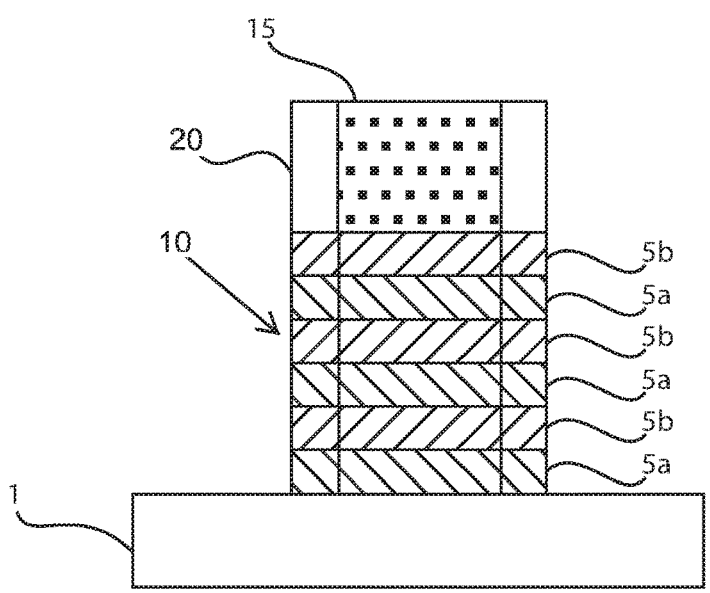
FIG. 2 is a side cross-sectional view of etching the exposed portions of the stack of two semiconductor materials with a first etch process, wherein the first etch process begins with removing one of the at least two semiconductor materials at a faster rate to provide an divot region undercutting the spacer, in accordance with the present disclosure.

FIG. 2 depicts etching the exposed portions of the stack 10 of two semiconductor materials 5a, 5b with a first etch process, wherein the first etch process includes a stage that removes one of the at least two semiconductor materials 5a, 5b at a faster rate to provide an divot region 25 undercutting the first spacer 20. FIG. 2 depicts one embodiment of etching the portions of the stack 10 of the least two semiconductor materials 5a, 5b that extend beyond an outer sidewall of the spacer 20. In some embodiments, a first stage of the first etch process for removing the portions of the stack 10 of the at least two semiconductor materials 5a, 5b is an anisotropic etch process. The term "anisotropic etch process" denotes a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation. In some embodiments, the etch process for etching the stack 10 is a timed etch. In the embodiment that is depicted in FIG. 2, the etch process may continue until the entirety of the portions of the stack 10 that extend beyond the outer sidewall of the spacer 20 are removed.

In some embodiments, the etch process for removing the portion of the stack 10 that extends beyond the outer sidewall of the spacer 20 may be a selective etch process. As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 1000:1. For example, the etch process may remove the exposed silicon and germanium containing material of the first semiconductor layer 5a, e.g., silicon germanium (SiGe), and the exposed silicon material that is free of germanium in the second semiconductor layer 5b, selectively to at least one of the silicon nitride material of the spacer 20, the replacement gate structure 15 and the substrate 1. In some embodiments, an etch block mask, such as a photoresist or hardmask, e.g., silicon nitride mask, may be formed over the replacement gate structure 15 during the etch process for removing the exposed portions of the stack 10 of the at least first and second semiconductor material 5a, 5b.

Figure 3:
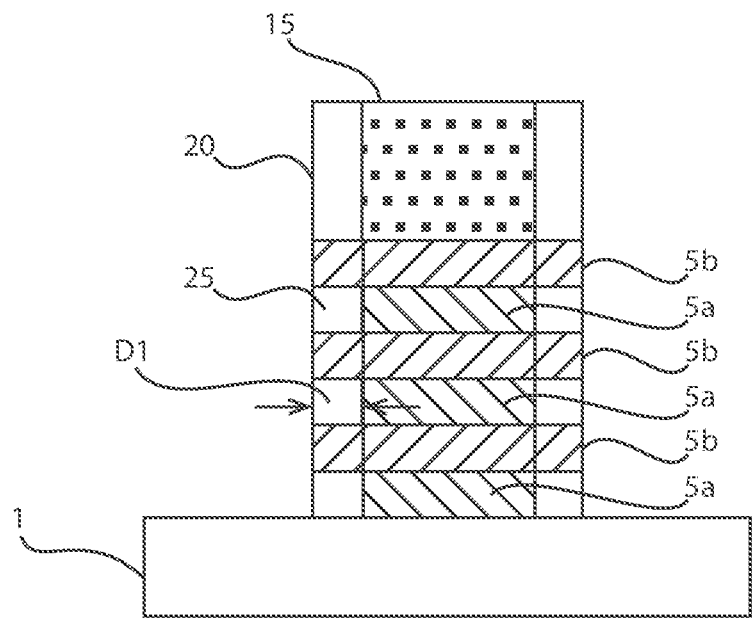
FIG. 3 is a side cross-sectional view depicting an etch process for removing at least one of the semiconductor materials in stack, and providing a divot that undercuts the spacer.

FIG. 3 depicting a second stage of the first etch process, which products a divot region 25 that undercuts the spacer 20. In some embodiments, the second stage of the first etch process is isotropic. By isotropic it is meant that the etch process is non-directional. The second stage of the first etch process may be referred to as an undercut etch or a lateral etch. In one embodiment, an isotropic etch, such as a plasma etch or wet chemical etch, may remove a portion of one of the first and second semiconductor layers 5a, 5b of the stack 10 selectively to at least one of the other semiconductor material layers of the stack 10. For example, when the first semiconductor material layer 5a of the stack 10 is composed of silicon germanium (SiGe), and the second semiconductor layer 5b of the stack 10 is composed of silicon (Si), the etch chemistry of the second stage of the first etch process may be selected to remove silicon germanium without substantially etching the silicon. The isotropic nature of the etch process produces a divot region 35 in the spacer 20 by removing the first semiconductor layer 5a etching inward from the exposed sidewall of the stack 10 that is substantially aligned with the outside sidewall of the spacer 20 selectively to the second semiconductor layer 5b. It is noted that removing the first semiconductor layer 5a selectively to the second semiconductor layer 5b is only one example of the present disclosure, and the etch selectivity with respect to the first and second semiconductor layers 5a, 5b and the isotropic etch may be reversed. The second etch stage, i.e., isotropic etch, may be continued until a divot region 25 is formed undercutting the spacer 20 that has a dimension D1 ranging from 1 nm to 20 nm. In another embodiment, the lateral etch step may be continued until a divot region 25 is formed undercutting the spacer 20 that has a dimension D1 ranging from 1 nm to 5 nm.

Figure 4A:
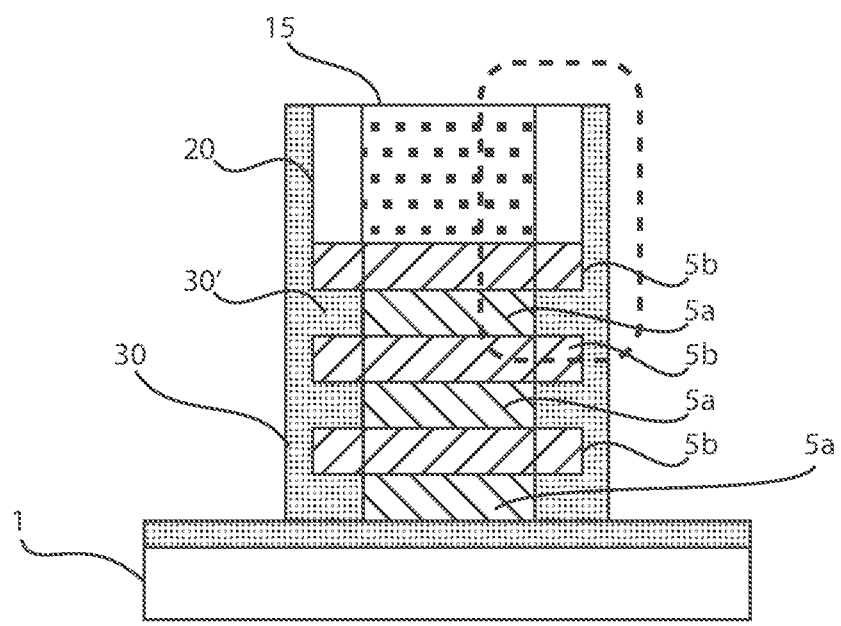
FIG. 4A is a side cross-sectional view depicting forming an atomic layer deposited (ALD) conformal dielectric layer over the gate structure, and etched sidewalls of the stack of two semiconductor materials, wherein the ALD conformal dielectric layer fills the divot.

FIG. 4A depicts forming an atomic layer deposited (ALD) conformal dielectric layer 30 over the replacement gate structure 15, and etched sidewalls of the stack of two semiconductor materials 5a, 5b of the material stack 10, wherein the ALD conformal dielectric layer 30 fills the divot region 25. The term "conformal" denotes a layer having a thickness that does not deviate from greater than or less than 30% of an average value for the thickness of the layer. The portion of the ALD conformal dielectric layer 30 that fills the divot region 25 may be referred to as a crescent shaped portion 30' of the composite spacer. Atomic Layer Deposition (ALD) uses self-limiting surface reactions to deposit material layers in the monolayer or sub-monolayer thickness regime. ALD is similar in chemistry to chemical vapor deposition (CVD), except that the ALD reaction breaks the CVD reaction into two half-reactions, keeping the precursor materials separate during the reaction. In some embodiments, the atomic layer deposition (ALD) process may be a thin film deposition method in which a film is grown on a substrate by exposing its surface to alternate gaseous species (typically referred to as precursors). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. In some embodiments, the monolayer deposition provided by the atomic layer depositions mechanisms provides that the layer be conformal.

In some embodiments, the atomic layer deposited (ALD) conformal dielectric layer 30 comprises depositing an oxide, nitride or oxynitride material layer. For example, the atomic layer deposited conformal dielectric layer 30 may be composed of silicon oxide ($SiO_2$). In another example, the atomic layer deposited conformal dielectric layer 30 may be composed of silicon nitride, e.g., $Si_3N_4$, or silicon oxynitride, e.g., $SiO_xN_y$. In yet other examples, the atomic layer deposited conformal dielectric layer 30 can be composed of high-k dielectric materials which can include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate, nitrided hafnium silicate (HfSiON), lanthanum oxide ($La_3O_2$), lanthanum aluminate ($LaAlO_3$), zirconium silicate ($ZrSiO_x$) and combinations thereof. It is noted that the above compositions are only examples of dielectric compositions that can be suitable for forming the atomic layer deposited conformal dielectric layer 30, and it is not intended that the present disclosure be limited to only those examples. Any material that is suitable for deposition using atomic layer deposition (ALD) methods may also be suitable for use with the methods and structures of the present disclosure so long as being suitable for filling the divot region 25.

In some embodiments, the atomic layer deposited (ALD) conformal dielectric layer 30 is also formed on the exposed sidewalls of the spacer 20, the exposed sidewalls of the etched portion of stack 10, the exposed upper surface of the replacement gate structure 15 and the exposed upper surface of the substrate 1.

Figure 4B:
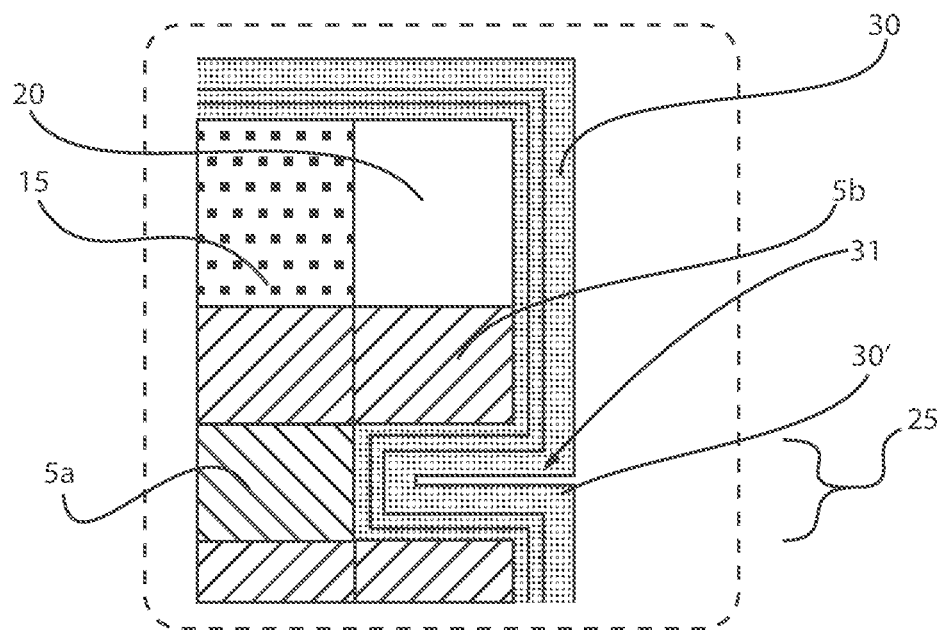
FIG. 4B is a magnified side cross-sectional view of the divot region depicted in FIG. 4A.

Referring to FIG. 4B, in some embodiments, the atomic layer deposited (ALD) conformal dielectric layer 30 is composed of multiple layers each being substantially conformal. Each layer may be composed of at least one monolayer. Each monolayer may correspond to a pulse of precursor material as part of the atomic layer deposition (ALD) process. For example, the atomic layer deposited (ALD) conformal dielectric layer 30 may be composed of 3 to 100 monolayers. The conformal nature of the ALD process forms a seal in the divot region 25 that includes a seam 26 that is centrally positioned in the divot region 25.

Figure 5:
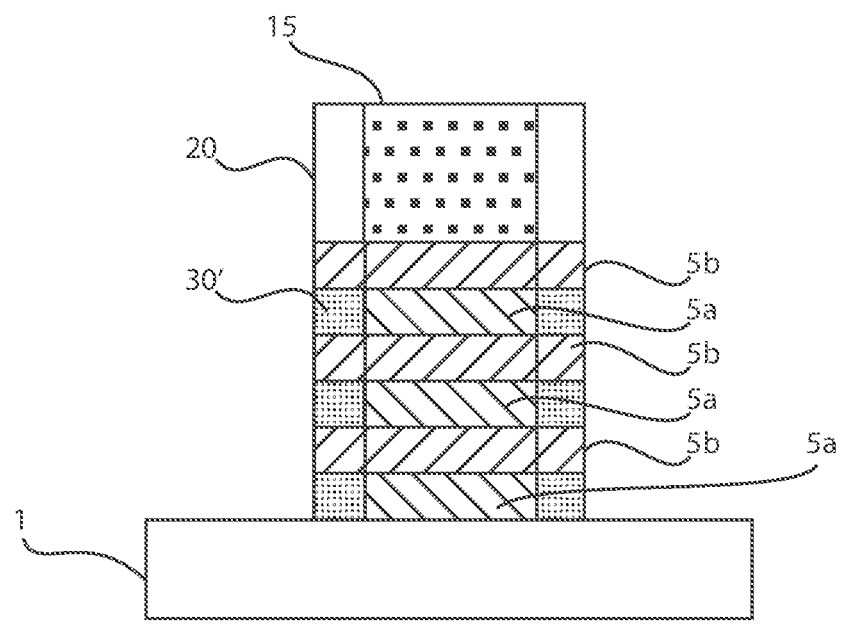
FIG. 5 is a side cross-sectional view depicting a second etch process to expose sidewalls of the stack of the two semiconductor materials, in accordance with one embodiment of the present disclosure.

FIG. 5 depicts a second etch process to exposes sidewalls of the remaining portion of the stack 10. The second etch process may include an isotropic etch, such as a plasma etch or wet chemical etch, that removes the atomic layer deposited (ALD) conformal dielectric layer 30 from the sidewalls of the spacer 20, the upper surface of the gate structure 14 and the upper surface of the substrate 1. The second etch may form a curvature in the atomic layer deposited (ALD) conformal dielectric layer 30 that is present in the divot region 25. The curvature undercuts the outside sidewall of the spacer 20.

Figure 6:
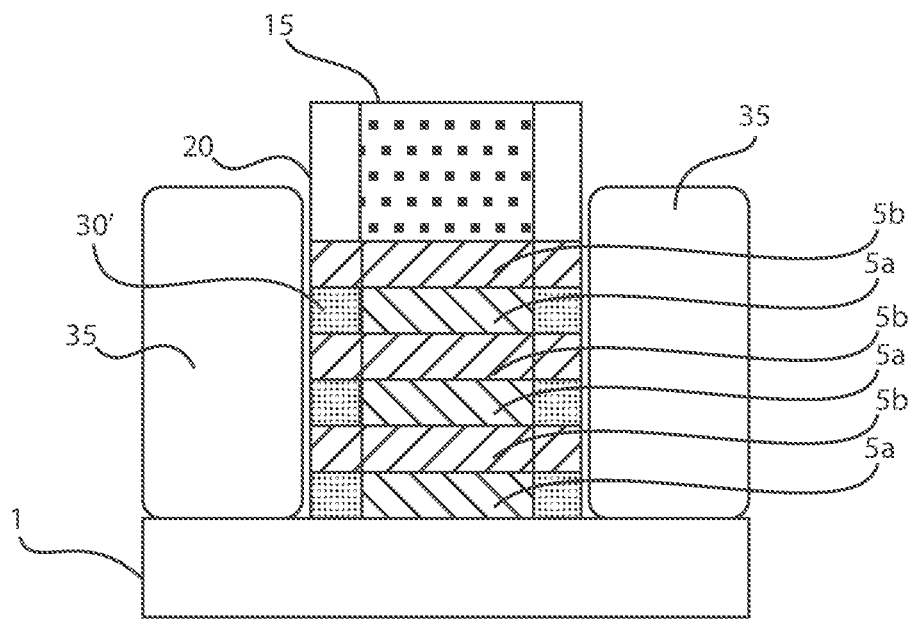
FIG. 6 is a side cross-sectional view depicting one embodiment of forming epitaxial semiconductor material on the exposed sidewalls of the stack of the two semiconductor materials that are depicted in FIG. 5, in accordance with one embodiment of the present disclosure.

FIG. 6 depicts one embodiment of forming epitaxial semiconductor material 35 on the exposed sidewalls of the remaining portion of the stack 10 of the two semiconductor materials 5a, 5b. The epitaxial semiconductor material 35 may provide at least a portion of the source and drain regions of the semiconductor device. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. As used herein, the term "drain" means a doped region in semiconductor device located at the end of the channel region, in which carriers are flowing out of the transistor through the drain. The term "source" is a doped region in the semiconductor device, in which majority carriers are flowing into the channel region.

The epitaxial semiconductor material 35 grows from the etched sidewall surface of the second semiconductor layer 5b. In some embodiments, the epitaxial semiconductor material 35 may be composed of silicon (Si), germanium (Ge), silicon germanium (SiGe), silicon doped with carbon (Si:C) or the epitaxial semiconductor material 35 may be composed of a type III-V compound semiconductor, such as gallium arsenide (GaAs). In one embodiment, a number of different sources may be used for the epitaxial deposition of the epitaxial semiconductor material 35. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming an undoped epitaxial semiconductor material 6a, 6b of a germanium containing semiconductor include germane, digermane, halogermane, dichlorogermane, trichlorogermane, tetrachlorogermane and combinations thereof.

Epitaxial deposition may be carried out in a chemical vapor deposition apparatus, such as a metal organic chemical vapor deposition (MOCVD) apparatus or a plasma enhanced chemical vapor deposition (PECVD) apparatus. The epitaxial semiconductor material 35 may be in situ doped to a p-type or n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In the embodiments in which the semiconductor device being formed has p-type source and drain regions, and is referred to as a p-type semiconductor device, the doped epitaxial semiconductor material 35 is doped with a p-type dopant to have a p-type conductivity. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine ($(CH_3)_3P$), dimethylphosphine ($(CH_3)_2PH$), triethylphosphine ($(CH_3CH_2)_3P$) and diethylphosphine ($(CH_3CH_2)_2PH$). The p-type gas dopant source may include diborane ($B_2H_6$).

Figure 7:
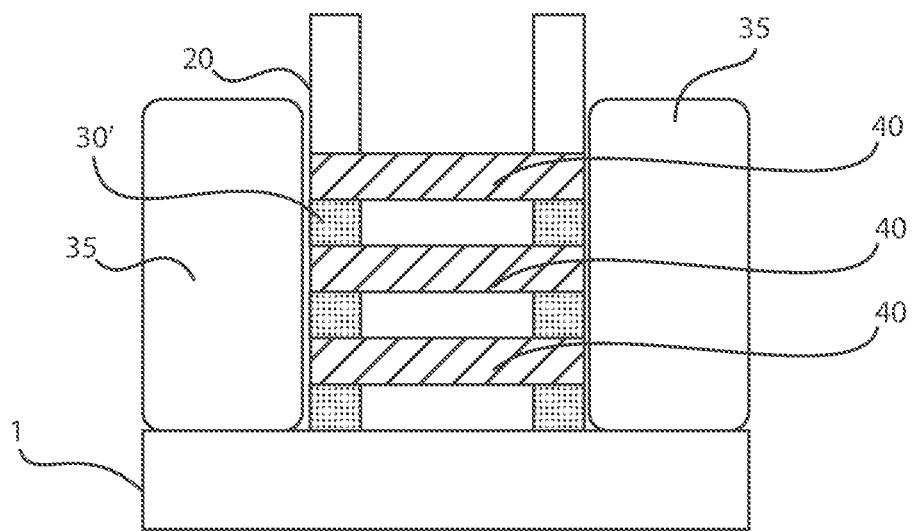
FIG. 7 is a side cross-sectional view depicting removing a replacement gate structure and removing one of the two semiconductor materials of the stack in a channel region of the device, in accordance with one embodiment of the present disclosure.

FIG. 7 depicts removing a replacement gate structure 15 and removing one of the two semiconductor materials, e.g., the first semiconductor material layer 5a, of the stack in a channel region of the device. In some embodiments, removing the replacement gate structure 15 may begin with forming an interlevel dielectric layer on the structure depicted in FIG. 6, and planarizing the interlevel dielectric layer to expose an upper surface of the replacement gate structure 15. The replacement gate structure 15 may be removed using a wet or dry etch process. In one embodiment, the replacement gate structure 15 may be removed by at least one of an anisotropic etch process, such as reactive ion etch (RIE), or an isotropic etch process, such as a wet chemical etch. In one example, the etch process for removing the replacement gate structure 15 can include an etch chemistry for removing the replacement gate structure 15 is selective to the material layers of the stack 10 of the first and second semiconductor material layers 5a, 5b.

Following removing the replacement gate structure 15, at least one of the material layers of the stack 10 is removed selectively to at least a remaining material composition that provides suspended channel structures 40. For example, in one embodiment when the first semiconductor material layer 5a is composed of silicon germanium (SiGe) and the second semiconductor material layer 5b is composed of silicon, the first semiconductor material layer 5a may be removed selectively to the second semiconductor material layer 5b with an etch process, such as a wet chemical etch.

In this example, following removal of one of the material layers of the stack 10, e.g., removal of the first semiconductor material layer 5a of the stack 10, a suspended channel structure 40 is provided. By "suspended channel" it is meant that at least one semiconductor material layer is present overlying the substrate 1, wherein the sidewalls of the suspended channel are supported, e.g., anchored, in the spacer 20. Gate structure materials, electrically conductive materials and/or semiconductor materials may be formed in the space surrounding the suspended structures.

Although FIG. 7 depicts three suspended channel structures 40, the present disclosure is not limited to only this embodiment. Any number of suspended channel structures 40, such as suspended nanowires and/or nanosheets, may be formed using the methods and structures provided by the present disclosure.

In some embodiments, the suspended channel structures may be further processed to provide a nanosheet or nanowire geometry. The term "nanosheet" denotes a substantially two dimensional structure with thickness in a scale ranging from 1 to 100 nm. The width and length dimensions of the nanosheet may be greater than the width dimensions. As used herein, the term "nanowire" describes a structure having a cross-section with a perimeter defined by a curvature, wherein a diameter of the cross-section is less than 1 micron. A nanowire may have an aspect ratio, e.g., height to width ratio, that is approximately 1. In some examples, the cross-section of the nanowire may have a diameter ranging from 1 nm to 40 nm.

The suspended channel structures 40 may be nanosheets. In some embodiments, the suspended channel structures 40 are further processed to provide nanowires. For example, a nanowire geometry can be produced from the suspended channel structures 40 using etch processing, such as isotropic etch processing. The nanowires may be multi-sided in cross section or may have an elliptical or cylindrical shape. In some embodiments, in which the suspended channel structures 40 are multi-sided cross section, e.g., square or rectangular cross section, and the suspended channel structures 40 are further processed to provide nanowires having an elliptical or cylindrical shape, the suspended channel structures may be smoothed 40 to form an elliptical shaped or cylindrical shaped nanowire using a hydrogen anneal. The portions of the suspended channel structures 40 that are underlying the spacer 20 are protected from being smoothed by the hydrogen anneal. In some embodiments, the hydrogen anneal that is employed in the present disclosure can be performed at a temperature from 600° C. to 1000° C. The pressure of hydrogen used during the hydrogen anneal can range from 5 torr to 600 torr.

Figure 8:
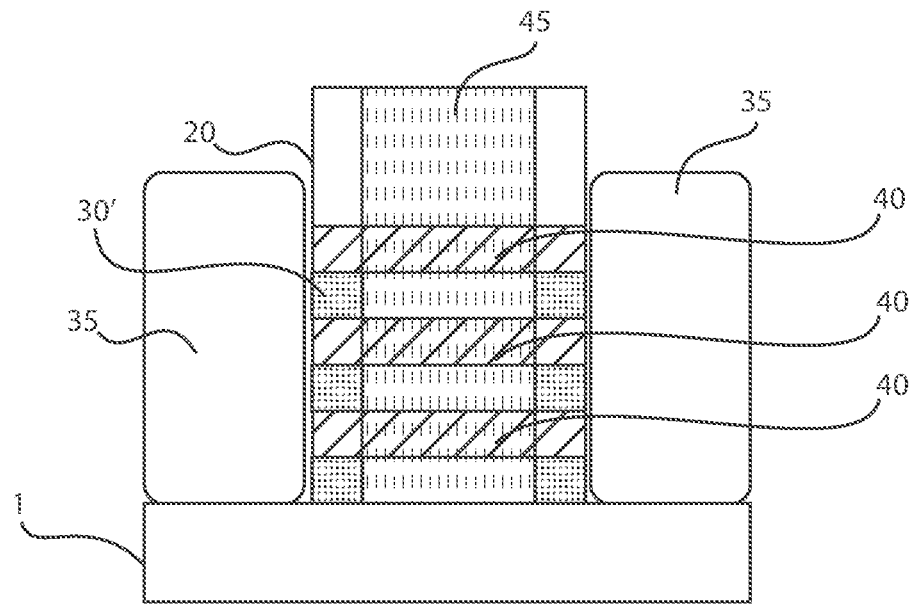
FIG. 8 is a side cross-sectional view depicting forming a functional gate structure in the gate opening that is formed by removing the replacement gate structure, in accordance with one embodiment of the present disclosure.

FIG. 8 depicts forming a functional gate structure 45 in the gate opening that is formed by removing the replacement gate structure 15. The functional gate structure 45 operates to switch the semiconductor device from an "on" to "off" state, and vice versa. The functional gate structure 45 may be formed by first depositing at least one gate dielectric on the suspended channel structures 40, e.g., nanowires or nanosheets, of the semiconductor device followed by filling the void with at least one gate conductor that is deposited on the at least one gate dielectric. The gate dielectric can be formed on the entirety of the exterior surface of the suspended channel structures 40.

The at least gate dielectric may comprise a semiconductor oxide, semiconductor nitride, semiconductor oxynitride, or a high k material having a dielectric constant greater than silicon oxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2ON_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. The at least one gate dielectric can be formed by chemical vapor deposition (CVD), such as plasma enhanced chemical vapor deposition (PECVD), metal organic chemical vapor deposition (MOCVD), or atomic layer deposition (ALD). In another embodiment, the at least one gate dielectric can be formed using thermal growth methods, such as oxidation.

The at least one gate conductor that is formed on the at least one gate dielectric may comprise an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayered combinations thereof. The at least one gate conductor can be formed utilizing a deposition process including, for example, chemical vapor deposition (CVD), plasma enhanced chemical vapor deposition (PECVD), physical vapor deposition (PVD), sputtering, atomic layer deposition (ALD) and other like deposition processes. In some embodiments, the at least one gate conductor may include a doped semiconductor material, e.g., n-type or p-type doped semiconductor material. For example, the at least one gate conductor may be composed of polysilicon, which can be doped within an appropriate impurity by utilizing either an in-situ doping deposition process or by utilizing deposition, followed by a step, such as ion implantation or gas phase doping, in which the appropriate impurity is introduced into the polysilicon.

Figure 9:
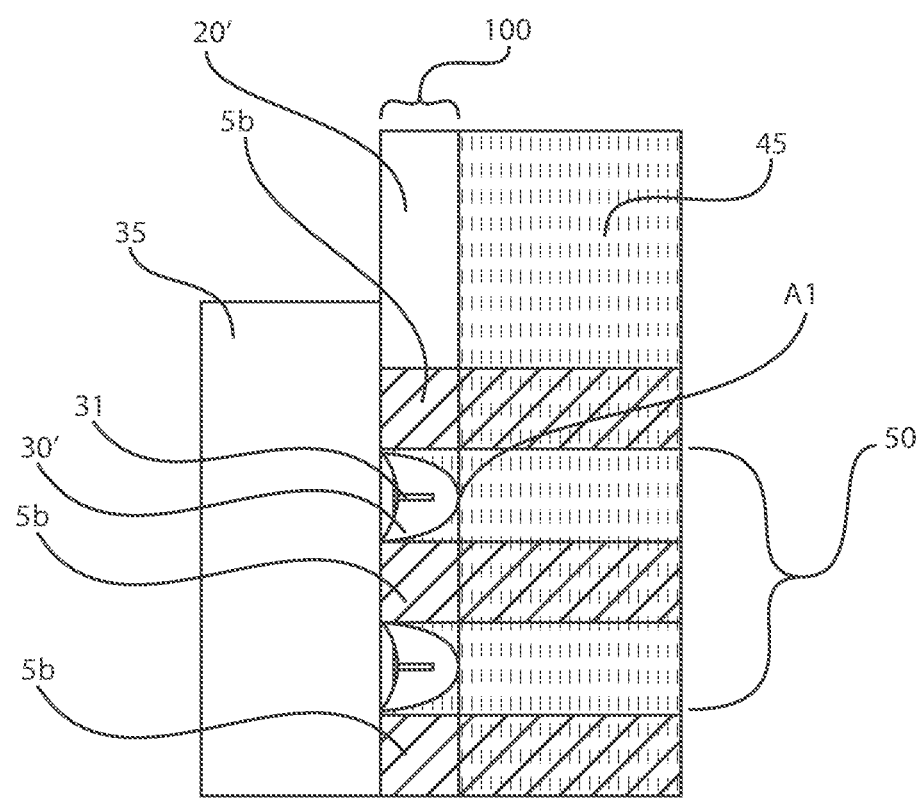
FIG. 9 is a side cross-sectional view illustrating a magnified view of the spacer depicted in FIG. 8.

FIG. 9 depicts one embodiment of a semiconductor device including a composite spacer 100 that may be formed in accordance the method described with reference to FIGS. 1-8. The semiconductor device may include a gate structure, i.e., functional gate structure 45, present on at least two suspended channel structures 40. As noted above, the suspended channel structures 40 may be nanosheets or nanowires. A composite spacer 100 may be present on sidewalls of the gate structure 45. The composite spacer 100 may include a cladding spacer 20' (which is provided by the original spacer 20 prior to undercut etching to form the divot region 35) present along a cap portion of the gate structure 45. The cap portion of the gate structure 45 extends from the upper surface of the gate structure 45 to the uppermost suspended channel structure 40. The composite spacer 100 also includes an inner spacer 50 along the channel portion of the gate structure 45 between adjacent channel semiconductor structures (also referred to as channel semiconductor layers). The channel portion of the gate structure 45 extends from the upper surface of the uppermost suspended channel structure 40 to the supporting substrate 1. The inner spacer 50 includes the crescent shape portions 30' filling the divot regions 25, wherein the crescent shaped portions include a substantially central seam 31. The inner spacer 50 and cladding spacer 20' may be composed of the same or different composition dielectric material. The semiconductor device depicted in FIGS. 8 and 9 further comprises source and drain regions comprising an epitaxial material 35 abutting an outer sidewall of the composite spacer 100.

Referring to FIG. 9, using the method described with reference to FIGS. 1-8, the apex A1 of the crescent shape is positioned more proximate to a sidewall of the gate structure 45 than the source and drain regions comprising the epitaxial material 35. In other embodiments of the present disclosure, as those described with reference to FIGS. 15-18, the apex may of the crescent shape may be positioned more proximate to the source and drain regions comprising the epitaxial material than a sidewall of the gate structure.

Figure 10:
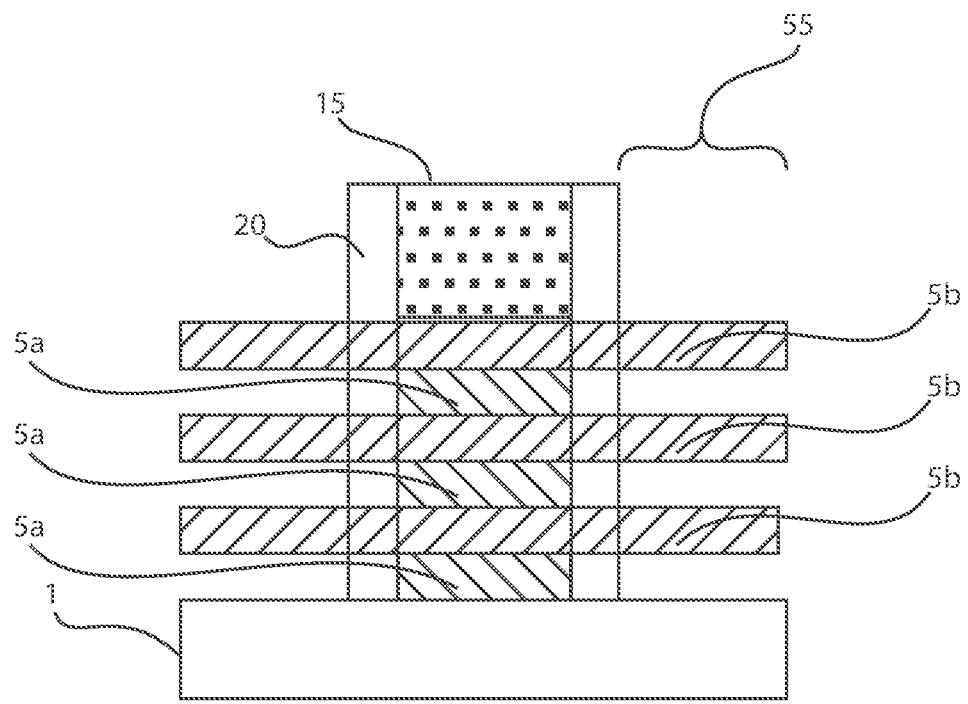
FIG. 10 is a side cross-sectional view of another embodiment of the present disclosure, in which the structure depicted in FIG. 1 is treated with a first etch process to remove one the at least two semiconductor materials to provide suspended source and drain semiconductor material layers, wherein a divot is formed undercutting the spacer between the suspended source and drain semiconductor material layers.

FIGS. 10-14 depict another embodiment of the present disclosure that employs suspended source and drain semiconductor material layers 55 that are formed from a stack 10 of first and second semiconductor materials 5a, 5b, as depicted in FIG. 1. This embodiment creates a nanowire device with different source and drain structures as what is shown in FIG. 8. FIG. 10 depicts treating the structure depicted in FIG. 1, which includes the stack 10 of first and second semiconductor materials 5a, 5b, a spacer 20, and replacement gate structure 15, with a first etch process to remove one the at least two semiconductor materials of the stack 10 to provide the suspended source and drain semiconductor material layers 55. The term "suspended" denotes that the source and drain semiconductor material layers may be present over the supporting substrate 1 and anchored into a spacer 20. Semiconductor material may be present between adjacent suspended source and drain semiconductor material layers 55.

For example, the first etch process may include a selective etch for removing the first semiconductor material layer 5a of the stack 10 selectively to the second semiconductor layer 5b of the stack 10. In this embodiment, the first etch process may be an isotropic etch. Removing the first semiconductor material layer 5a with an isotropic etch typically forms a divot region 25 undercutting the spacer 20 between the remaining layers of the second semiconductor material layer 5b. Further details regarding the formation of the divot region 25 have been described above with reference to FIG. 3.

Figure 11:
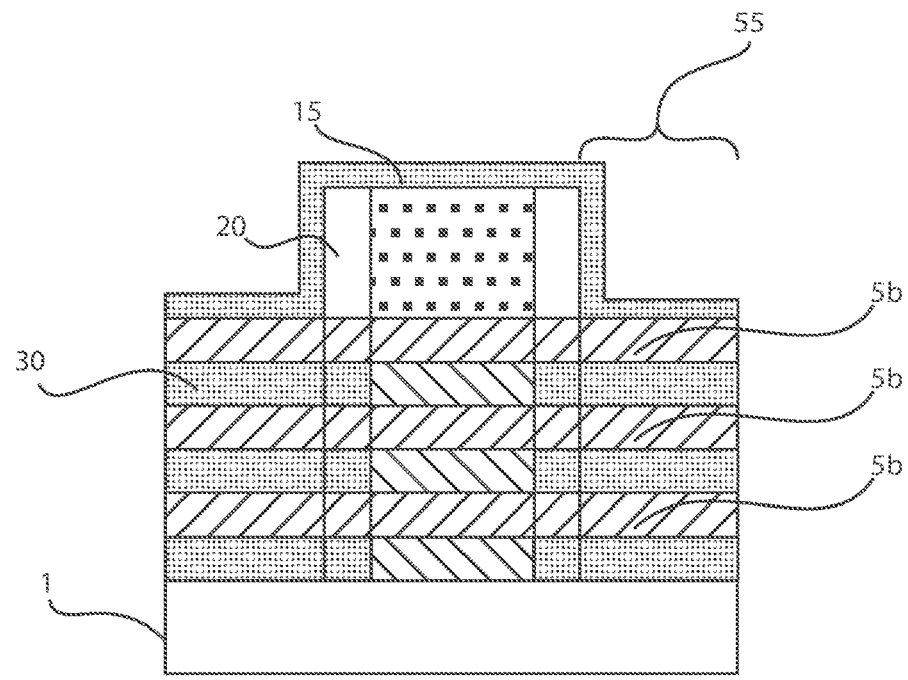
FIG. 11 is a side cross-sectional view depicting forming an atomic layer deposited (ALD) conformal dielectric layer over the gate structure, and etched sidewalls of the stack of two semiconductor materials, wherein the ALD conformal dielectric layer fills the divot.

FIG. 11 depicts forming an atomic layer deposited (ALD) conformal dielectric layer over the gate structure, and etched sidewalls of the stack of two semiconductor materials, wherein the ALD conformal dielectric layer fills the divot. As depicted in FIG. 11, in this embodiment, the atomic layer deposited (ALD) conformal dielectric layer 30 is formed filling the divot region 25, as well as being present filling the space between the suspended source and drain semiconductor material layers 55. The atomic layer deposited (ALD) conformal dielectric layer 30 that is depicted in FIG. 11 is similar to the atomic layer deposited (ALD) conformal dielectric layer 30 that is described above with reference to FIGS. 4A and 4B. Therefore, the description of the atomic layer deposited (ALD) conformal dielectric layer 30 that is depicted in FIGS. 4A and 4B is suitable for providing further details of the atomic layer deposited (ALD) conformal dielectric layer 30 that is depicted in FIG. 11.

Figure 12:
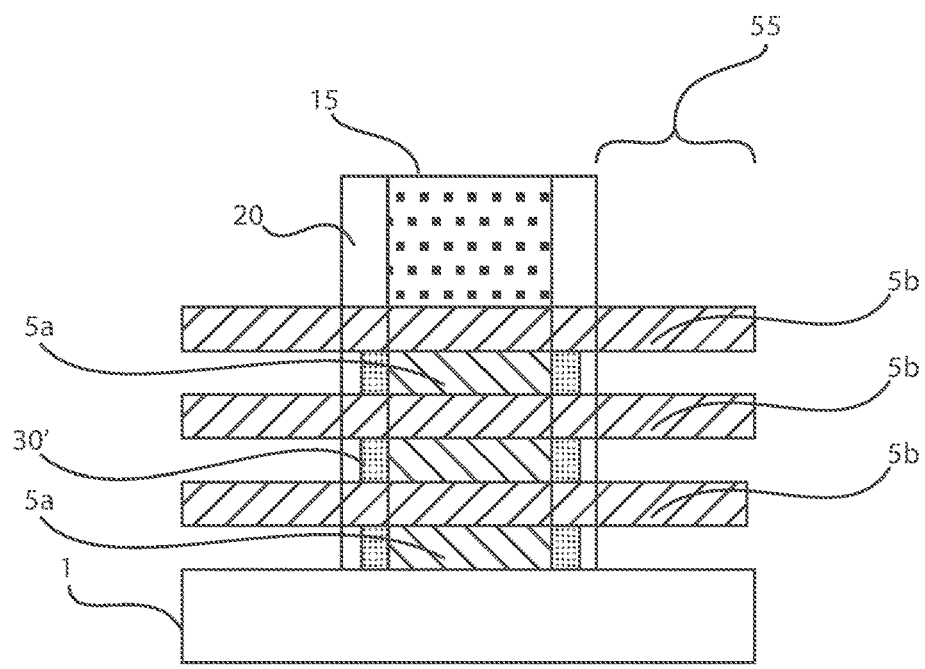
FIG. 12 is a side cross-sectional view depicting a second etch process to remove a majority of the ALD conformal dielectric layer, wherein a remaining portion of the ALD conformal dielectric layer is present in the divot, in accordance with one embodiment of the present disclosure.

FIG. 12 depicts an etch process to remove a majority of the ALD conformal dielectric layer 30, wherein a remaining portion of the ALD conformal dielectric layer 30 is present in the divot 25. The etch process removes the atomic layer deposited (ALD) conformal dielectric layer 30 from the replacement gate structure 45 and from the space between the suspended source and drain semiconductor material layers 55, wherein a remaining portion of the ALD conformal dielectric layer 30 is present in the divot 25. The remaining portion of the ALD conformal dielectric layer 30 that is present in the divot 25 may be referred to as a crescent shaped portion 30' of a composite spacer. The etch process for removing the majority of the ALD conformal dielectric layer 30 that is depicted in FIG. 12 may form a curvature in the atomic layer deposited (ALD) conformal dielectric layer 30 that is present in the divot region 25. The curvature undercuts the outside sidewall of the spacer 20. The etch process for removing the majority of the ALD conformal dielectric layer 30 that is depicted in FIG. 12 is similar to the etch process describe above with reference to FIG. 5. Therefore, further details for the etch process depicted in FIG. 12 may be found in the above description of FIG. 5.

Figure 13:
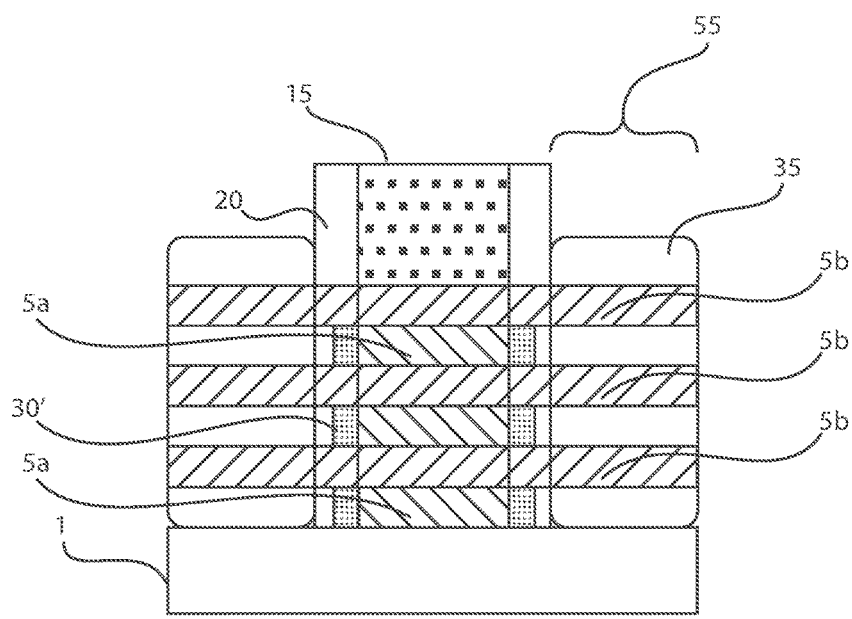
FIG. 13 is a side cross-sectional view depicting forming epitaxial semiconductor material on the suspended source and drain semiconductor material layers.

FIG. 13 depicts forming epitaxial semiconductor material 45 on the suspended source and drain semiconductor material layers 55. The above description for forming the epitaxial semiconductor material 45 that is depicted in FIG. 6 is suitable for the description of forming the epitaxial semiconductor material 45 that is depicted in FIG. 13.

Figure 14:
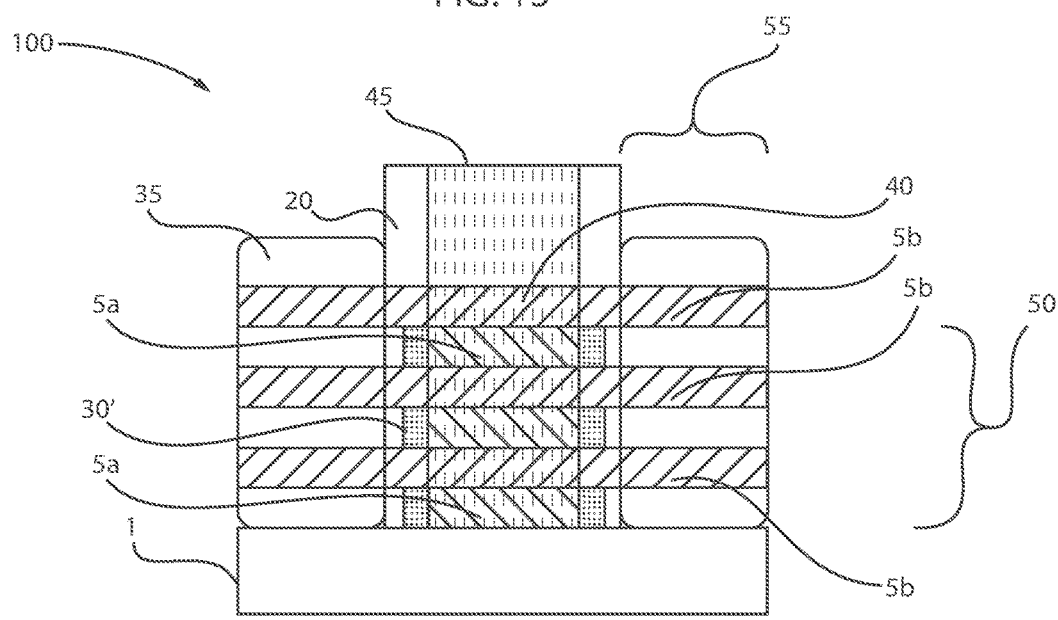
FIG. 14 is a side cross-sectional view depicting removing the replacement gate structure from the semiconductor device that is depicted in FIG. 13, forming suspended channel structures, and forming a functional gate structure, in accordance with one embodiment of the present disclosure.

FIG. 14 depicts a final structure of a semiconductor device following removing the replacement gate structure 15, forming suspended channel structures 40, and forming a functional gate structure 45 in the gate opening that is produced by removing the replacement gate structure 15. The suspended channel structures 40 may be nanosheets or nanowires. The steps of removing the replacement gate structure 15, forming suspended channel structures 40, and forming a functional gate structure 45 for the embodiment depicted in FIGS. 10-14 is similar to these steps in the embodiment described with reference to FIGS. 1-8.

The semiconductor device structure that is formed using the method described in FIGS. 10-14 has a composite spacer 100 similar to the composite spacer 100 depicted in FIG. 10. For example, the composite spacer 100 produced by the process flow described in FIGS. 10-14 may include a cladding spacer 20 (which is provided by the original spacer 20 prior to undercut etching to form the divot region 25) present along a cap portion of the gate structure 45, and an inner spacer 50 along the channel portion of the gate structure 45 between adjacent channel semiconductor structures (also referred to as channel semiconductor layers). The inner spacer 50 includes the crescent shape portions 30' filling the divot regions 25, wherein the crescent shaped portions 30' include a substantially central seam 31. The inner spacer 50 and cladding spacer 20' may be composed of the same or different composition dielectric material.

Figure 15:
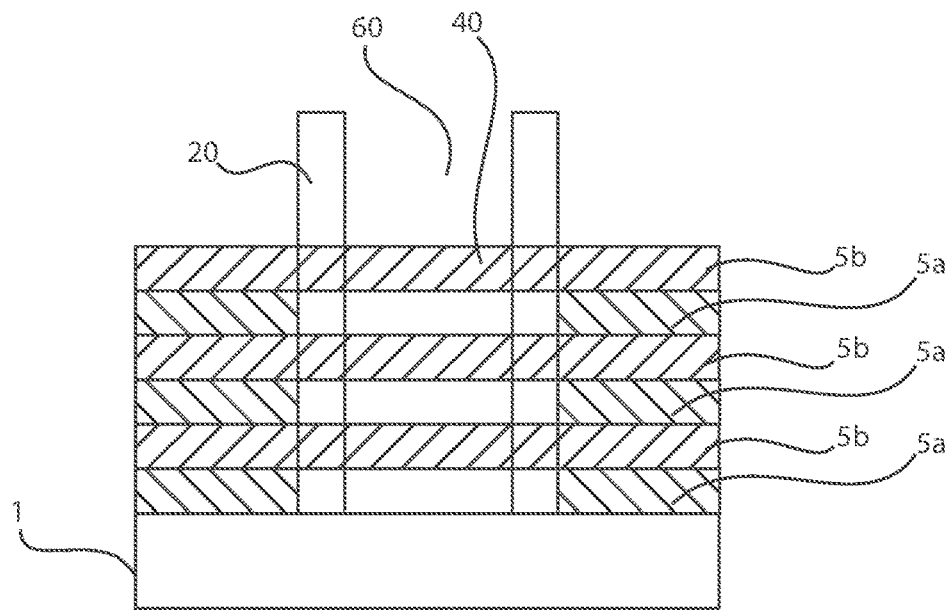
FIG. 15 is a side cross-sectional view depicting removing a replacement gate structure to provide a gate opening that exposes a channel portion of a stack of two semiconductor materials, in accordance with another embodiment of the present disclosure.

FIGS. 15-18 depict another embodiment of the present disclosure that provides a composite spacer including an inner spacer having crescent shaped portions 30' with a centrally positioned seam 31 for a nanowire device. FIG. 15 depicts removing a replacement gate structure 15 from the structure depicted in FIG. 1 to provide a gate opening 60 that exposes a channel portion of a stack 10 of two semiconductor materials 5a, 5b. The gate opening 60 has a width defined by inner sidewalls of a spacer 20 that was present on sidewalls of the replacement gate structure 15 prior to its removal. Removing the replacement gate structure 15 exposes a channel portion of the stack 10 of the two semiconductor materials 5a, 5b. The replacement gate structure 15 may be removed by a sequence that includes depositing an interlevel dielectric layer on the structure depicted in FIG. 1, planarizing the interlevel dielectric layer to expose the upper surface of the replacement gate structure, and using an etch process to remove the replacement gate structure 15.

FIG. 15 further depicts applying a first etch process to remove one of the at least two semiconductor materials 5a, 5b in the gate opening 50 to provide suspended channel semiconductor layers 40 (hereafter referred to as suspended channel structures). The suspended channel structures 40 depicted in FIG. 15 are similar to the suspended channel structures 40 that are described above with reference to FIG. 7. Therefore, the above description of the suspended channel structures 40 depicted in FIG. 7 is suitable for the description of the suspended channel structures 40 that are depicted in FIG. 15. For example, the suspended channel structures 40 may be nanosheets, nanowires or a combination thereof.

FIG. 15 further depicts one embodiment of forming a divot region 25 undercutting the spacer 20 between the suspended channel structure 40. The divot region 25 may be formed by applying an isotropic etch to the gate opening 60. The isotropic etch may include an etch chemistry that removes one of the first and second semiconductor material layers 5a, 5b selectively to the other from the portion of the stack 10 that remains underlying the spacer 20. For example, when the suspended channel structure 40 is composed of the second semiconductor material layer 5b of the stack, the etch chemistry may be selected to remove the first semiconductor material layer that is underlying the spacer 20.

Figure 16:
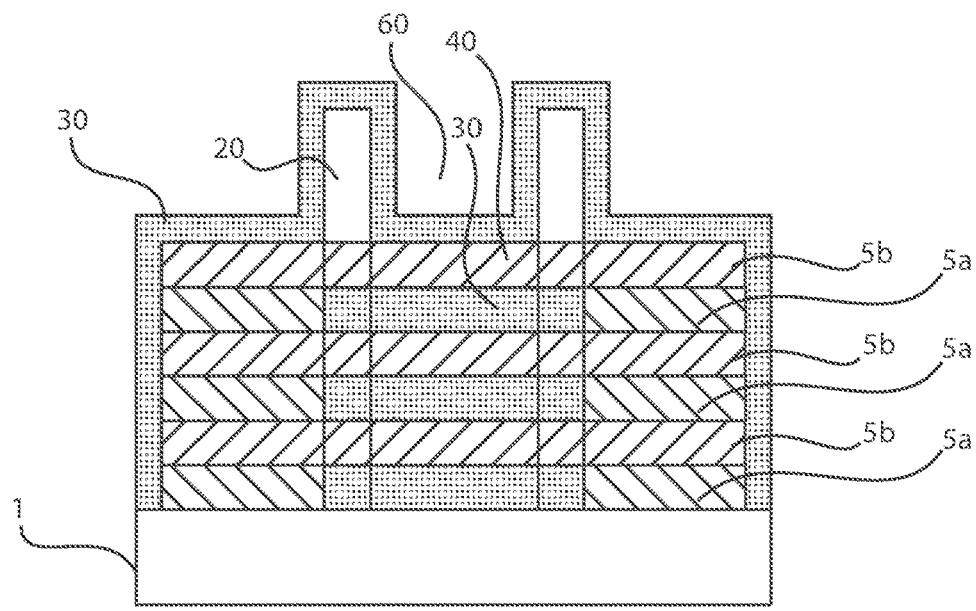
FIG. 16 is a side cross-sectional view depicting forming an atomic layer deposited (ALD) conformal dielectric layer on sidewalls of the channel opening, wherein the ALD conformal dielectric layer fills the divot, in accordance with one embodiment of the present disclosure.

FIG. 16 depicting forming an atomic layer deposited (ALD) conformal dielectric layer 30 on sidewalls of the channel opening 60, wherein the ALD conformal dielectric layer 30 fills the divot region 25. In the embodiment depicted in FIG. 16, the atomic layer deposited (ALD) conformal dielectric layer 30 fill the gate space 60. The atomic layer deposited (ALD) conformal dielectric layer 30 depicted in FIG. 16 is similar to the atomic layer deposited (ALD) conformal dielectric layer 30 that is described above with reference to FIGS. 4A and 4B. Therefore, the description of the atomic layer deposited (ALD) conformal dielectric layer 30 that is depicted in FIGS. 4A and 4B is suitable for providing further details of the atomic layer deposited (ALD) conformal dielectric layer 30 that is depicted in FIG. 16. For example, the atomic layer deposited (ALD) conformal dielectric layer 30 may be composed of an oxide, nitride or oxynitride material layer.

Figure 17:
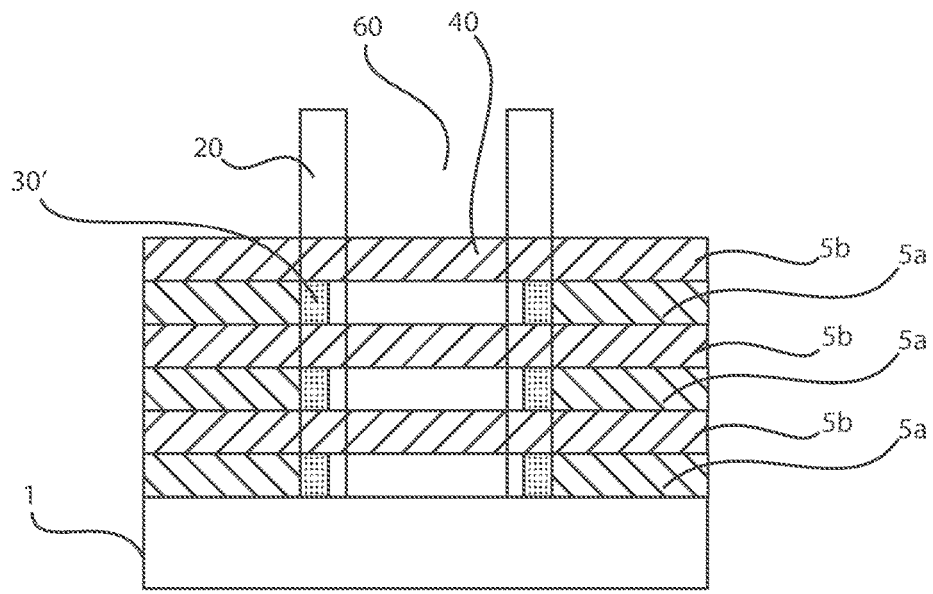
FIG. 17 is a side cross-sectional view depicting a second etch process for removing a majority of the ALD conformal dielectric layer depicted in FIG. 16, wherein the divot remains filled with a remaining portion of the ALD conformal dielectric layer.

FIG. 17 depicts a second etch process for removing a majority of the ALD conformal dielectric layer 30 that is depicted in FIG. 16, wherein the divot region 25 remains filled with a remaining portion of the ALD conformal dielectric layer 30'. Removing the majority of the ALD conformal dielectric layer 30 can expose sidewalls of the channel opening 60, wherein the divot region 25 remains filled.

The remaining portion of the ALD conformal dielectric layer 30 that is present in the divot region 25 may be referred to as a crescent shaped portion 30' of a composite spacer. The etch process for removing the majority of the ALD conformal dielectric layer 30 that id depicted in FIG. 17 may form a curvature in the atomic layer deposited (ALD) conformal dielectric layer 30 that is present in the divot region 25. The curvature undercuts the inside sidewall of the spacer 20. The etch process for removing the majority of the ALD conformal dielectric layer 30 that is depicted in FIG. 16 is similar to the etch process describe above with reference to FIG. 5. Therefore, further details for the etch process depicted in FIG. 16 may be found in the above description of FIG. 5.

Figure 18:
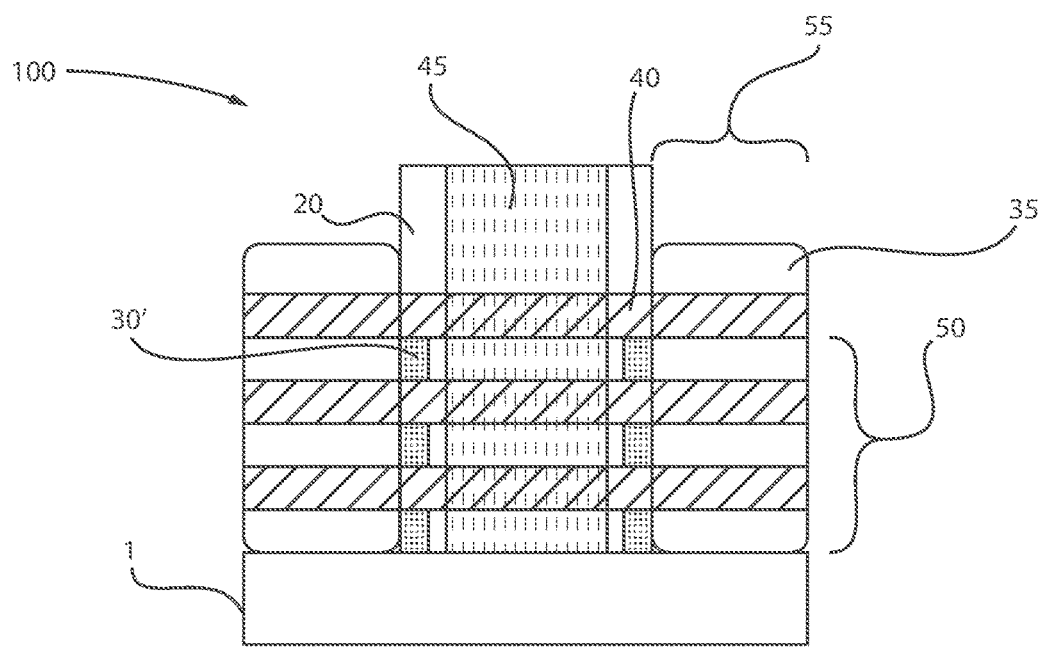
FIG. 18 is a side cross-sectional view depicting forming a functional gate structure in the channel opening, and forming epitaxial semiconductor material on the suspended source and drain semiconductor material layers.

FIG. 18 depicts forming a functional gate structure 45 in the gate opening 60, forming suspended source and drain material layers 55, and forming epitaxial semiconductor material 35 on the suspended source and drain semiconductor material layers 55. The step of forming a functional gate structure 45 in the gate opening 60 in the embodiment depicted in FIG. 18 is similar to the embodiment of forming the functional gate structure 45 depicted in FIG. 18. The step of forming the suspended source and drain material layers 55 depicted in FIG. 18 has been described above in FIG. 10. The step of forming the source and drain regions of the epitaxial material 35 depicted in FIG. 18 has been described above in FIG. 13.

The semiconductor device structure that is formed using the method described in FIGS. 15-18 has a composite spacer 100 similar to the composite spacer 100 depicted in FIG. 10. For example, the composite spacer 100 produced by the process flow described in FIGS. 15-18 may include a cladding spacer 20 (which is provided by the original spacer 20 prior to undercut etching to form the divot region 35) present along a cap portion of the gate structure 45, and an inner spacer 50 along the channel portion of the gate structure 45 between adjacent channel semiconductor structures (also referred to as channel semiconductor layers). The inner spacer 50 includes the crescent shape portions 30' filling the divot regions 25, wherein the crescent shaped portions 30' include a substantially central seam 31. The inner spacer 50 and cladding spacer 20' may be composed of the same or different composition dielectric material. One difference between the composite spacer 100 formed by the methods depicted in FIGS. 1-9 and 11-15, and the composite spacer 100 formed by the method depicted in FIGS. 15-18 is that the apex of the crescent shape 30' produced by the method depicted in FIGS. 15-18 may be positioned more proximate to the source and drain regions comprising the epitaxial material 35 than a sidewall of the gate structure 45.

The methods and structures that have been described above with reference to FIGS. 1-18 may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device comprising:
    etching exposed portions of a stack of at least two semiconductor materials with an etch process, wherein the etch process includes a stage that removes one of the at least two semiconductor materials at a faster rate than a second of the at least two semiconductor materials to provide a divot region undercutting an overlying spacer, wherein the etch process removes one of the at least two semiconductor materials so that the remaining semiconductor material provides suspended source and drain semiconductor material layers; and
    forming a plurality of atomic layer deposited (ALD) conformal dielectric monolayers that fills the divot region, wherein a seam is centrally positioned in the divot resulting from two portions of the conformal dielectric contacting each other in the ALD conformal dielectric layer that fills the divot region.

2. The method of claim 1, further comprising forming epitaxial source and drain regions.

3. The method of claim 2, wherein said forming epitaxial source and drain regions forming the epitaxial semiconductor material on an etched sidewall of the stack that is substantially aligned with the outer sidewall of the spacer.

4. The method of claim 1, wherein the etching of the exposed portions of the stack of at least two semiconductor materials removes the entirety of the stack of the at least two semiconductor materials that extends beyond an outer sidewall of a spacer to a gate structure.

5. The method of claim 1, further comprising applying an etch process after said forming the plurality of ALD conformal dielectric monolayers to provide the exposed sidewalls of the remaining semiconductor material of the stack of two semiconductor materials.

6. The method of claim 1, wherein filling the divot forms at least a portion of an inner spacer having a crescent shape.

7. The method of claim 6, wherein the inner spacer is comprised of an oxide.

8. The method of claim 7, wherein the inner spacer is comprised of a nitride.

9. A method of forming a semiconductor device comprising:
    etching exposed portions of a stack of at least two semiconductor materials with an etch process to provide a divot region undercutting an overlying spacer; and
    forming a plurality of atomic layer deposited (ALD) conformal dielectric monolayers that fills the divot region, wherein a seam is centrally positioned in the divot resulting from two portions of the conformal dielectric contacting each other in the ALD conformal dielectric layer that fills the divot region.

10. The method of claim 9, wherein the etch process removes one of the at least two semiconductor materials so that the remaining semiconductor material provides suspended source and drain semiconductor material layers.

11. The method of claim 9, wherein the etching of the exposed portions of the stack of at least two semiconductor materials removes the entirety of the stack of the at least two semiconductor materials that extends beyond an outer sidewall of the overlying spacer.

12. The method of claim 9, wherein filling the divot forms at least a portion of an inner spacer having a crescent shape.

13. The method of claim 12, wherein the inner spacer has a substantially central seam.

14. The method of claim 9, wherein the inner spacer is comprised of an oxide.

15. The method of claim 9, wherein the inner spacer is comprised of a nitride.

16. A method of forming a semiconductor device comprising:
    etching exposed portions of the stack of at least two semiconductor materials with an etch process, wherein the etch process includes a stage that removes one of the at least two semiconductor materials at a faster rate than a second of the at least two semiconductor materials to provide a divot region undercutting an overlying spacer; and
    forming a plurality of atomic layer deposited (ALD) conformal dielectric monolayers that fills the divot region, wherein a seam is centrally positioned in the divot resulting from two portions of the conformal dielectric contacting each other in the ALD conformal dielectric layer that fills the divot region, wherein filling the divot forms at least a portion of the inner spacer having a crescent shape.

17. The method of claim 16, wherein the inner spacer is comprised of an oxide.

18. The method of claim 16, wherein the inner spacer is comprised of a nitride.

* * * * *